United States Patent
Perner

(10) Patent No.: US 6,954,373 B2
(45) Date of Patent: Oct. 11, 2005

(54) APPARATUS AND METHOD FOR DETERMINING THE LOGIC STATE OF A MAGNETIC TUNNEL JUNCTION MEMORY DEVICE

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 53 days.

(21) Appl. No.: 10/609,278

(22) Filed: Jun. 27, 2003

(65) Prior Publication Data

US 2004/0264237 A1 Dec. 30, 2004

(51) Int. Cl.[7] .............................................. G11C 11/00
(52) U.S. Cl. ........................ 365/158; 365/171; 365/173
(58) Field of Search ................................ 365/158, 171, 365/173, 207, 189.09

(56) References Cited

U.S. PATENT DOCUMENTS 6,587,371 B1 * 7/2003 Hidaka ........................ 365/173
6,813,208 B2 * 11/2004 Baker ......................... 365/207

* cited by examiner

*Primary Examiner*—David Lam

(57) ABSTRACT

A system and method for determining the logic state of a magnetic tunnel junction (MTJ) memory device. The method includes applying a first bias voltage to a selected line and measuring a first induced voltage across the MJT device or a memory cell. The method also includes applying a second bias voltage to the selected line, the second bias voltage being different from the first bias voltage, and measuring a second induced voltage across the MJT device. The method also includes comparing a function of the first bias voltage, the first induced voltage, the second bias voltage, and the second induced voltage to a threshold value.

27 Claims, 9 Drawing Sheets

APPARATUS AND METHOD FOR DETERMINING THE LOGIC STATE OF A MAGNETIC TUNNEL JUNCTION MEMORY DEVICE

BACKGROUND

A typical magnetic tunnel junction (MTJ) memory device includes an array of memory cells. Each of the cells may be constructed of two layers of magnetic film, separated by a dielectric layer. The magnetization of one of the layers is alterable and the magnetization of the other layer is fixed or "pinned" in a particular direction. The magnetic film layer having alterable magnetization may be referred to as a "data storage layer" and the magnetic film layer which is pinned may be referred to as a "reference layer."

FIG. 1 is a plan view illustration of a simplified magnetic random access memory (MRAM) array, which is an exemplar MTJ memory device. The array 100 includes memory cells 120, row lines 130, and column lines 132. The row lines 130 and column-lines 132 are herein referred to collectively as "write lines," and they may also be used to read data stored in the data storage layer. The memory cells 120 are positioned at each intersection of a row line 130 and a column line 132. Generally, the row lines 130 and column lines 132 are arranged in orthogonal relation to one another and the memory cells 120 are positioned between the column lines 132 and the row lines 130.

FIGS. 2A, 2B and 2C collectively illustrate the storage of a bit of data in a single memory cell 120 of the MRAM array of FIG. 1. As illustrated in FIG. 2A, memory cell 120 includes an active magnetic data film 122 and a pinned magnetic film 124 which are separated by a dielectric region 126. The orientation of magnetization in the active magnetic data film 122 is not fixed and can assume either of two stable orientations, as shown by arrow M1. In contrast, the pinned magnetic film 124 has a fixed orientation of magnetization, as shown by arrow M2. The active magnetic data film 122 rotates its orientation of magnetization in response to electrical currents applied to the write lines (i.e., the column lines 130 and write lines 132 of FIG. 1) during a write operation to the memory cell 120. The first logic state of the data bit stored in memory cell 120 is indicated when M1 and M2 are parallel to each other, as illustrated in FIG. 2C. When M1 and M2 are parallel, a logic "1" state may be said to be stored in the memory cell 120. Conversely, a second logic state is indicated when M1 and M2 are anti-parallel to each other, as illustrated in FIG. 2B. When M1 and M2 are anti-parallel, a logic "0" state may be said to be stored in the memory cell 120. In FIGS. 2B and 2C, the dielectric region 126 has been omitted. Although FIGS. 2A, 2B and 2C collectively illustrate the active magnetic data film 122 positioned above the pinned magnetic film 124, the pinned magnetic film 124 alternatively may be positioned above the active magnetic data film 122.

When measured by a current flowing parallel to axle 123, the resistance of the memory cell 120 differs according to the relative orientations of M1 and M2. When M1 and M2 are anti-parallel (e.g., the logic "0" state), the resistance of the memory cell 120 is at its highest. On the other hand, the resistance of the memory cell 120 is at its lowest when the orientations of M1 and M2 are parallel (e.g., the logic "1" state). Consequently, the logic state of the data bit stored in the memory cell 120 can be determined by measuring, either directly or indirectly, the resistance of the memory cell 120.

A selected magnetic memory cell 120 may be given a desired logic state by applying electrical currents to the particular row and column lines that intersect at the selected magnetic memory cell. An electrical current applied to the particular column line may generate a magnetic field substantially aligned along the easy axis of the selected magnetic memory cell. The magnetic field aligned to the easy axis is generally referred to as a longitudinal write field. An electrical current applied to the particular row line may generate a magnetic field substantially perpendicular to the easy axis of the selected magnetic memory cell. Generally, only one selected magnetic memory cell receives both the longitudinal and the perpendicular write fields at any one time. Non-selected memory cells that are coupled to the same row line as the selected cell receive only the perpendicular write field. Non-selected memory cells that are coupled to the same column line as the selected cell receive only the longitudinal write field.

Because MTJ memory devices operate on the principle of the quantum mechanical tunnel effect, the magnitude of the sense current in a particular cell, and hence the resistance of the cell, is very highly dependent on the thickness of the dielectric layer 126. Because variations in dielectric thickness within an array of MTJ devices cannot be completely eliminated by existing thin film process techniques, these variations can cause seemingly disproportionate variations in the magnitude of the sense current that is measured within different cells in the array. These variations can lead to ambiguity in determining the logic state of different cells within an array. The practical implications of this ambiguity are such that, when operating an MTJ memory device array, a large number of errors potentially may occur during the process of retrieving data if the data state of any one cell is determined by comparing that cell's resistance to some pre-determined threshold value. This ambiguity occurs because the difference in resistance between cells having the same stored logic state can easily exceed the difference in resistance of one cell as its logic state is switched from a "1" to a "0".

One way to overcome this ambiguity is to employ a data retrieval process known as a destructive read. A destructive read generally involves the following steps: (1) measuring the magnitude of sense current in a cell a first time in response to an applied voltage; (2) writing the cell to a known (previously determined) state (i.e., to a "1" or a "0"); (3) measuring the magnitude of the sense current in the cell a second time in response to a second application of the same applied voltage previously applied in step 1; and (4) determining whether the logic state of the bit in question was originally a "1" or a "0" based on the difference of the magnitude of the sense current between the first measurement and the second measurement. In addition, if the original state of the cell, as determined in step 4, is different from the state to which the cell was written during step 2, the cell must be returned to its original state by another write operation. For example, if the cell was written to a "11" during step 2, and the determination in step 4 indicated that the cell was originally a "0", the cell must be written back to its original "0" state after the destructive read is completed. On the other hand, if the cell was written to a "1" during step 2, and the determination in step 4 indicated that the cell was originally a "1", it would be not be necessary to perform a re-write operation to return the cell to its original state.

Although a destructive read process can be used to determine the state of a cell, this process has several shortcomings. Because the destructive read process requires that the cell be written to a known value and then, in some cases, written back to its original value, the destructive read process markedly increases read access time. The additional write operations also increase power consumption and may decrease the life expectancy of the cell.

The destructive read process also tends to exacerbate an undesirable condition known as half-select switching. Half-select switching may occur in an MTJ memory array having N×M cells, where N and M are greater than 1, when a write operation directed at one cell inadvertently causes an undesired change of state in another cell in the array. Ideally, a cell in an MTJ memory array will switch its logic state only when subjected to both longitudinal and perpendicular write fields, and will not switch its logic state when subjected only to either the longitudinal write field or the perpendicular write field, but not both. Thus, the magnitudes of the longitudinal and the perpendicular write fields should be sufficiently high so that the cells in the array switch their logic states only when subjected to both the longitudinal write field and the perpendicular write field. At the same time, the magnitudes of the longitudinal and the perpendicular write fields should be sufficiently low so that the cells in the array do not switch their logic states when subjected only to either the longitudinal write field or the perpendicular write field, but not both. However, in some cases a cell in the array may change its state even though it is only subjected to either the longitudinal write field or the perpendicular write field, but not both. This undesirable switching of a magnetic memory cell that receives only the longitudinal or the perpendicular write field is commonly referred to as half-select switching.

Half-select switching can, if present, cause catastrophic errors when operating an MTJ memory array. For example, an attempt to switch the logic state of a first cell in an array from "0" to "1" may have the inadvertent and undesired effect of erroneously changing the logic state of a second cell in the array from "0" to "1" as well. To minimize the potential for half-select switching, it is preferable to keep the number of write operations to a minimum. However, the destructive read process requires at least one extra write operation for each cell being read, and potentially two extra write operations if the cell must be re-written to its original state. Therefore, the destructive read process increases the likelihood that half-select switching will occur.

BRIEF DESCRIPTION OF THE DRAWINGS

The present invention, as defined in the claims, can be better understood with reference to the following drawings. The components within the drawings are not necessarily to scale relative to each other, emphasis instead being placed upon clearly illustrating the principles of the present invention.

Figure 1:
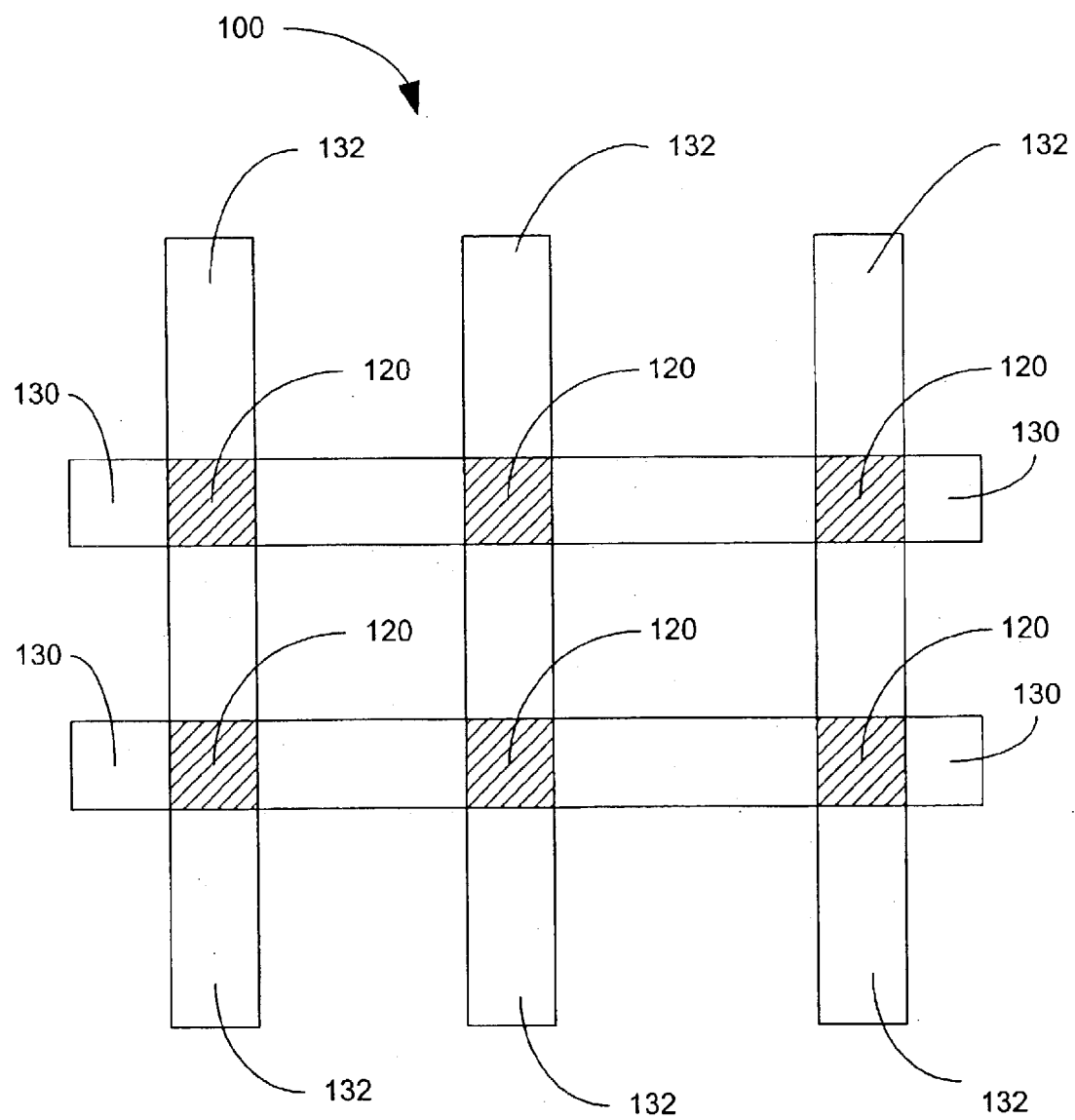
FIG. 1 is a prior art illustration of a simplified magnetic random access memory (MRAM) array.
Figure 2A:
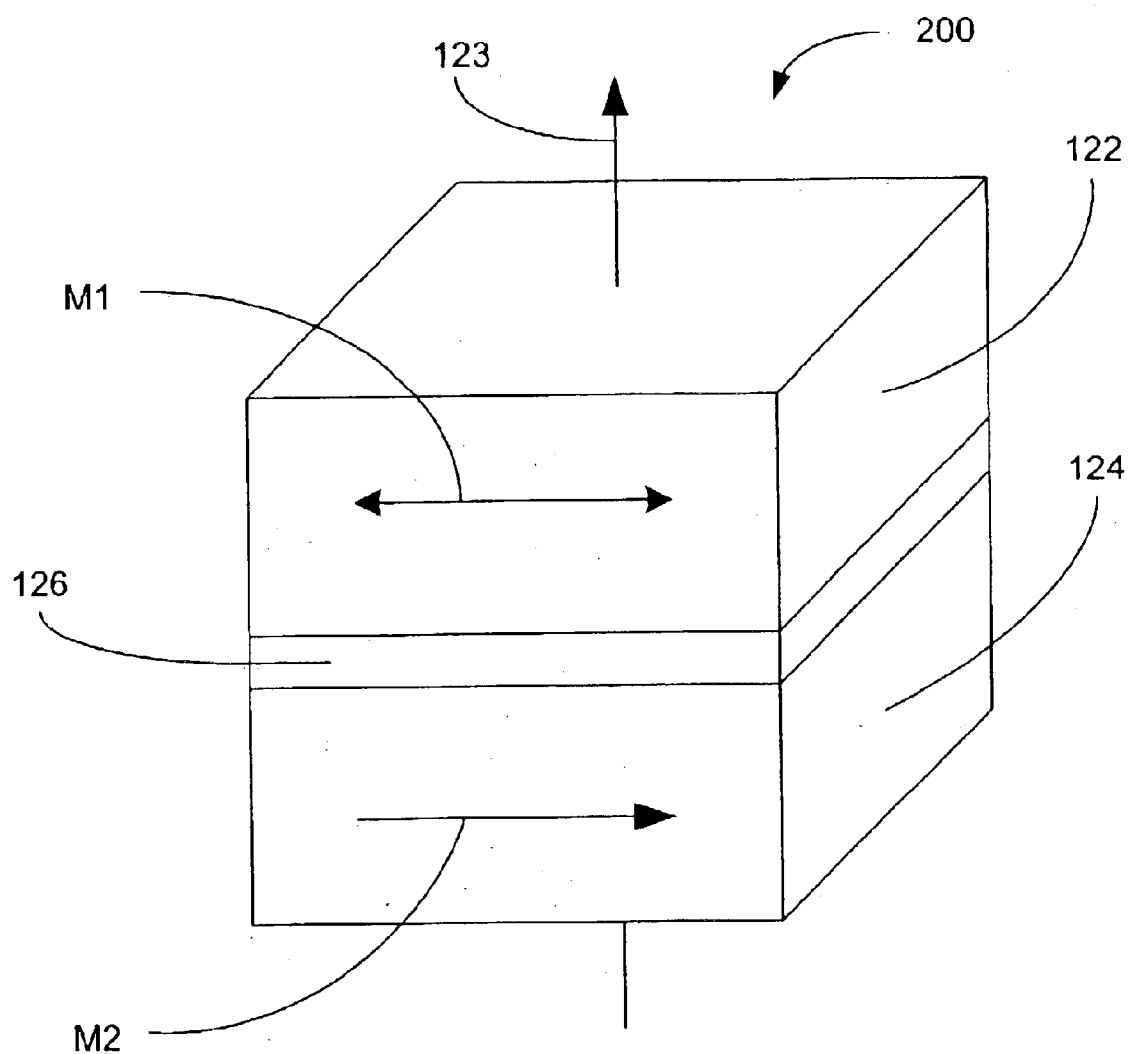
FIG. 2A is a prior art illustration of the storage of a bit of data in a single memory cell of the MRAM array of FIG. 1.
Figures 2B, 2C:
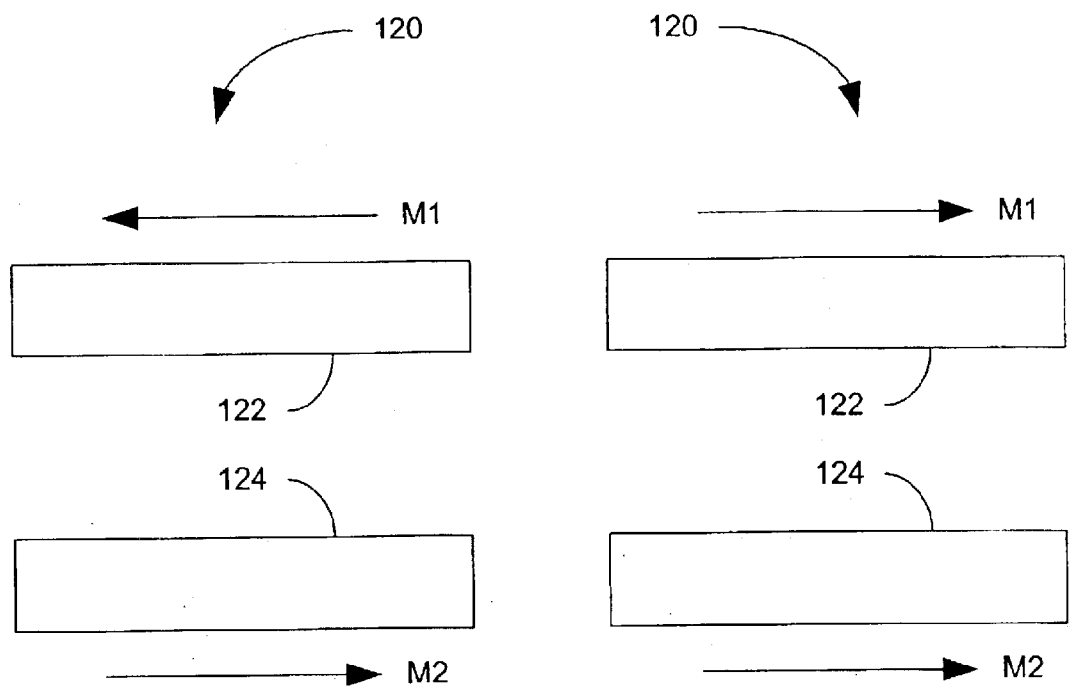
FIG. 2B is a prior art illustration of an anti-parallel magnetization state for the memory cell of FIG. 2A.
FIG. 2C is a prior art illustration of a parallel magnetization state for the memory cell of FIG. 2A.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

NOTATION AND NOMENCLATURE

Certain terms are used throughout the following description and claims to refer to particular system components and configurations. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or a direct electrical connection. Thus, if a first device couples to a second device, that connection may be through a direct electrical connection, or through an indirect electrical connection via other devices and connections.

DETAILED DESCRIPTION

In the following detailed description, reference is made to the accompanying drawings which form a part hereof, and in which are shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims. For example, although described below as applied to a magnetic random access memory (MRAM) array, the invention is generally applicable to any device that uses an MTJ memory cell, or other similar memory cells, as a storage element, including but not limited to MRAMs, EEPROMS, flip-flops, shift-registers.

Figure 3:
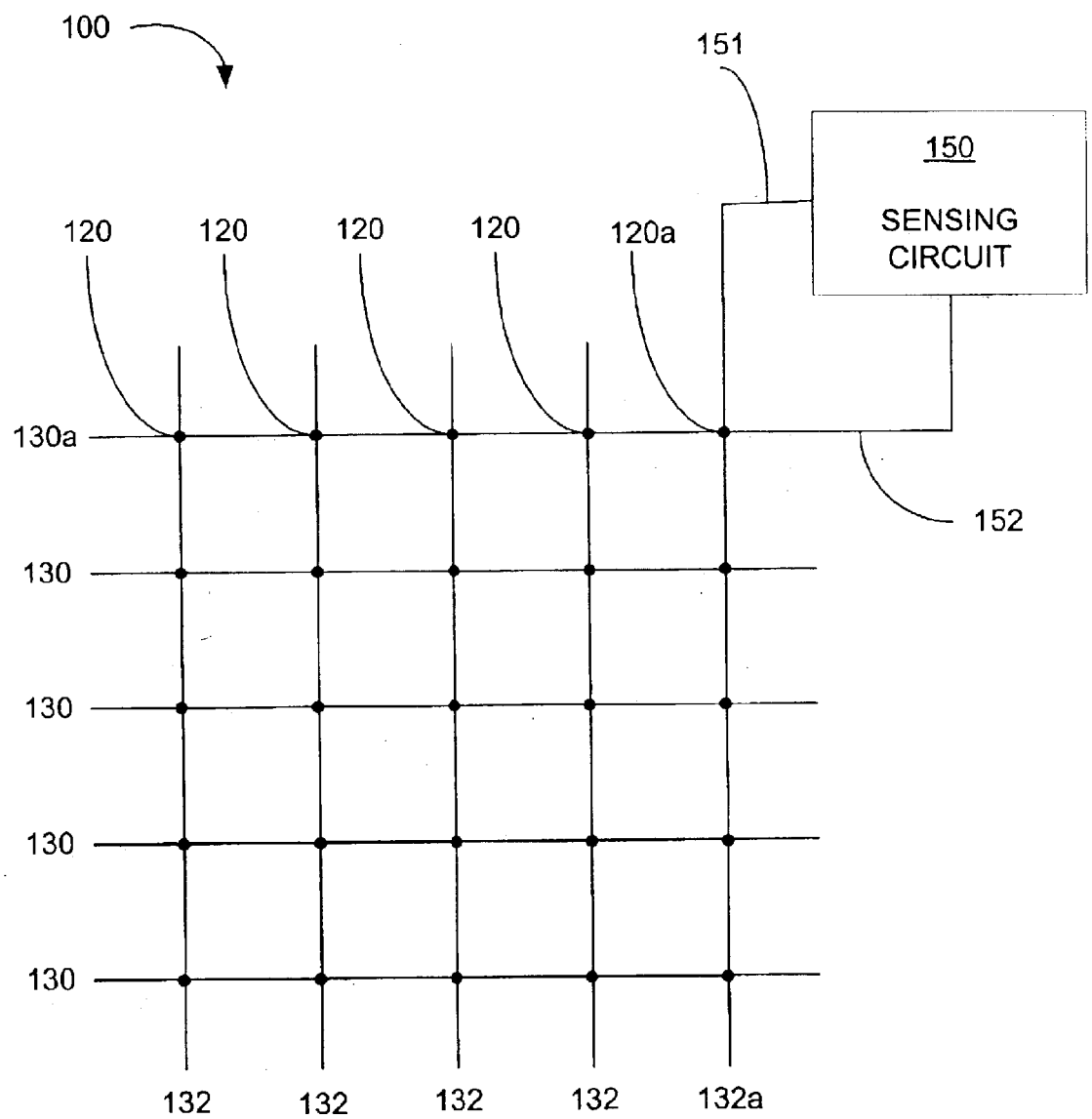
FIG. 3 is a simplified embodiment of an MTJ array 100 having a sensing circuit 150.

Referring now to the figures, wherein like reference numerals indicate corresponding components throughout the several views, FIG. 3 is a simplified illustration of an MTJ array 100 having a sensing circuit 150 for measuring an electrical characteristic associated with one or more cells 120 of the array 100. The array 100 is comprised of a plurality of row lines 130 and a plurality of column lines 132. As described with respect to FIG. 1, a memory cell 120 is formed at each intersection of a row line 130 and a column line 132. For simplicity, only the cells 120 on the top row are numbered, but it should be understood that a cell 120 is formed at each intersection of lines 130 and lines 132. The particular cell 120 for which the electrical characteristic is to be measured is denoted as cell 120a.

One sensing method involves measuring a current through the cell 120a as the electrical characteristic. When the electrical characteristic is a sense current, a bias voltage ($V_a$) may be applied to each of the column lines 132 of MTJ array 100. The same bias voltage ($V_a$) may also be applied to each of the row lines 130 of MTJ array 100, with the exception of the row line 130 that intersects cell 120a, which for clarity is denoted as line 130a. For a symmetric array having N row lines and N column lines, bias voltage $V_a$ would be applied to all N of the column lines and to N−1 of the row lines. A second bias voltage ($V_b$) may be applied to the row line 130a that intersects cell 120a. In various implementations, $V_a > V_b$ and in a particular implementation, $V_b$ is ground potential. Thus, the voltage drop for each of the cells 120 in the array, with the exception of cells 120 and 120a is zero ($V_a - V_a$). The voltage drop for cell 120a is ($V_a - V_b$), which results in a sense current ($I_{sc}$) flowing from column line 132a through cell 120a to row line 130a.

Sensing circuit 150 may be coupled to cell 120a by connections 151 and 152. Sensing circuit 150 may measure the current required to maintain column line 132a at bias voltage $V_a$, which ideally equals the sense current ($I_{sc}$) that flows through cell 120a as a result of the voltage drop ($V_a - V_b$). The resistance (R) of the memory cell 120a at the voltage drop ($V_a - V_b$) may be calculated by dividing the voltage drop ($V_a - V_b$) by the sense current ($I_{sc}$).

Variations of this sensing method may also be used, in which a bias voltage $V_a$ is applied to column line 132a and each of the row lines 130 (except 130a). A second bias voltage $V_b$ may-be applied to row line 130a and each column line 132 (except 132a). Again, a sense current flows through the selected cell 120a due to the voltage drop, and this current is ideally equal to the current flowing from (or to) the bias voltage sources for lines 130a and 132a.

Another sensing method involves measuring a voltage drop across cell 120a as the electrical characteristic. As is described in more detail below with respect to FIG. 5 and FIG. 6, when the electrical characteristic is a voltage drop, a bias voltage ($V_a$) may be applied to row line 130a, and a second bias voltage ($V_b$) may be applied to the remaining row lines 130 of MTJ array 100. A bias voltage may be applied to each of the column lines 132 (except line 132a), or they may be allowed to "float". Column line 132 is allowed to float. In various implementations, $V_a > V_b$ and in a particular implementation, $V_b$ is ground potential. Thus, a voltage divider arrangement between the resistance of the selected cell 120a and the "sneak" resistance of the remaining cells 120 on column line 132a is established. If the sneak resistance is known, a measurement of the voltage on column line 132a may be used to determine the resistance of cell 120a. Alternatively, as explained further below, an indication of the resistance across the cell 120a may be determined by making measurements with at least two different bias voltages.

Figure 4:
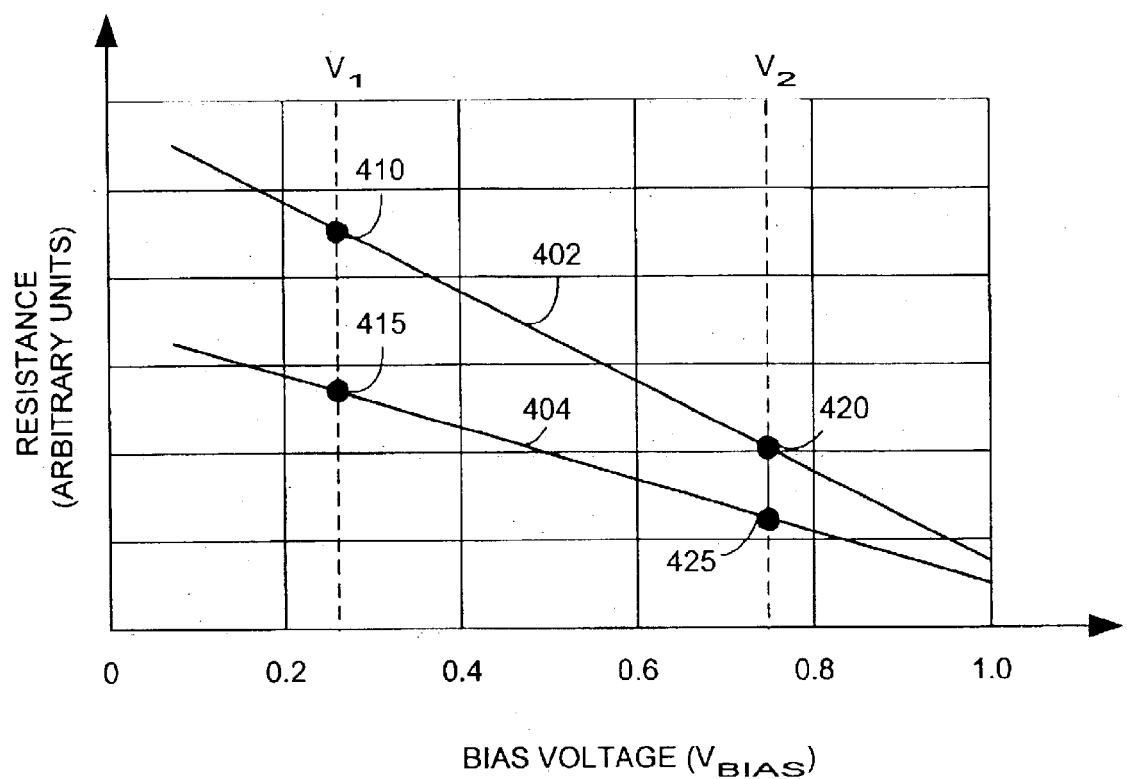
FIG. 4 is a graphical illustration of resistance values of an MTJ memory device measured as a function of applied bias voltage for parallel and anti-parallel orientations of the magnetic storage layer.

FIG. 4 is a graphical illustration of the resistance values of a MTJ memory cell measured as a function of applied bias voltage for parallel ($R_p$) and anti-parallel ($R_{ap}$) orientations of the magnetic storage layer. The data are for a Ferromagnet-Insulator-Ferromagnet (FM-I-FM) MTJ device. Curve 402 illustrates the resistance of the cell in the anti-parallel state as a function of the applied bias voltage ($V_{BIAS}$). Curve 404 illustrates the resistance of the cell in the parallel state as a function of the applied bias voltage ($V_{BIAS}$).

The curves of FIG. 4 illustrate that the resistance of the cell in the anti-parallel state is greater than the resistance of the cell in the parallel state for each applied bias voltage. The difference between the resistance in the anti-parallel state and from the resistance in the parallel state is dependent on the magnitude of the applied bias voltage (i.e., the difference in resistance between the anti-parallel and parallel states decreases as the applied bias voltage is increased).

The curve 402 has a resistance value 410 at bias voltage $V_1$ and a resistance value 420 at bias voltage $V_2$. The curve 404 has a resistance value 415 at bias voltage $V_1$ and a resistance value 425 at bias voltage $V_2$. Note that the slope (m) of the line between points 410 and 420 is larger that the slope of the line between the points 415 and 425.

As illustrated in FIG. 4, the gradient of the resistance versus applied bias curve in the anti-parallel state (curve 402) may be considerably larger than in the parallel state (curve 404). This trait of MTJ devices may be quantified by the device's tunneling magneto resistance ratio (TMR). The TMR can be computed by dividing the difference between the anti-parallel resistance and the parallel resistance ($R_{ap} - R_p$) by the parallel resistance ($R_p$) at each bias point. Thus, TMR=$(R_{ap} - R_p)/R_p$ The TMR of an MTJ device decreases as the voltage bias increases. Such a device might feasibly be operated at a read bias point having a TMR of ~20–25%. However, the TMR value at the read bias point may be increased by, operating the device at a lower applied bias. Conversely, if it were necessary to operate the device at a higher applied bias the TMR value at the read bias point would be reduced. Operating at the higher applied bias may limit the magnitude of the upper bias point at which such devices are operated.

Figure 5:
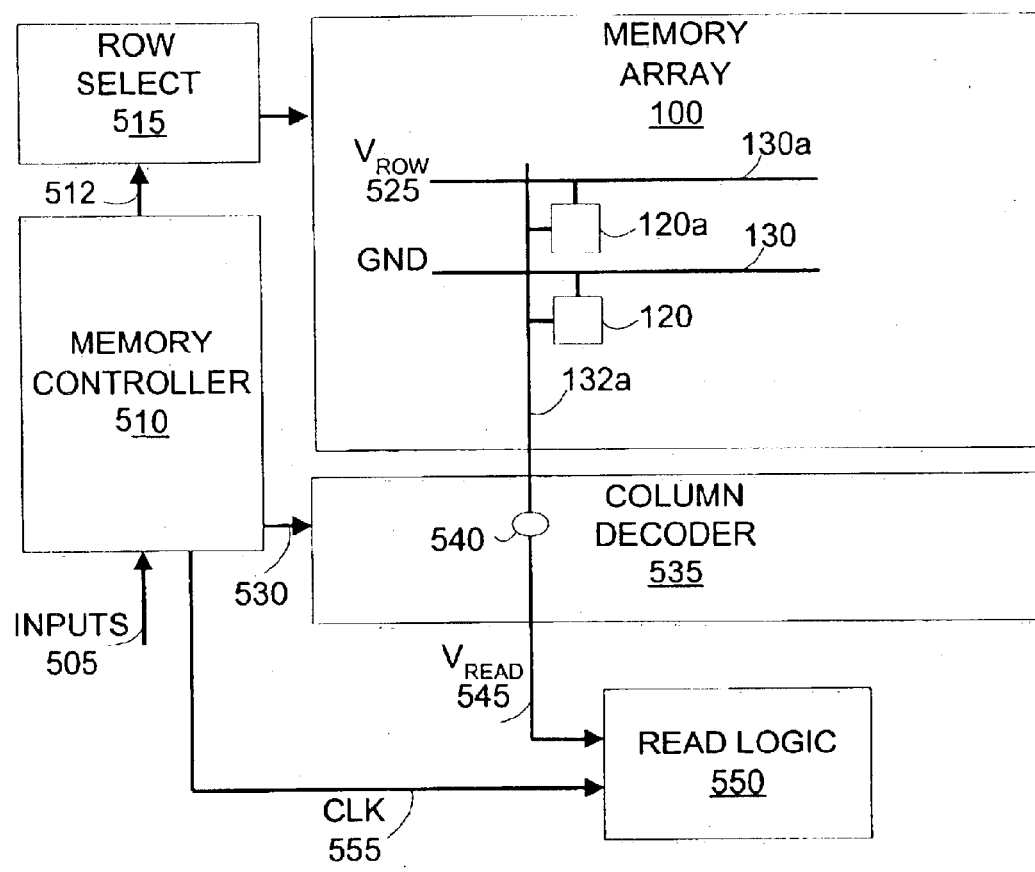
FIG. 5 is a block diagram showing the structure of an MRAM memory cell array and sensing elements, according to one embodiment of the present invention.

Referring now to FIG. 5, a resistive memory array 100 shows one context for various embodiments of the present invention. A row selector circuit 515 and a column decoder circuit 535 are connected to the memory array 100. The row selector circuit 515 may select a row having memory cell 120a by providing a bias voltage $V_{ROW}$ 525 on the appropriate row 130a of the memory cell 120a, and grounding the other rows 130. The column decoder circuit 535 may select a column having memory cell 120a by coupling the column line 132a to a read logic 550. Read logic 550 may be connected through switch 540 in the column decoder circuit 535 to the column line 132a of the selected memory cell 120a. When row selector circuit 515 applies a voltage $V_{ROW}$ 525 to the row line 130a of the selected memory cell 120a, a voltage $V_{READ}$ 545 may be measured on the column line 132a. As previously discussed, a second, different row voltage may be applied to row line 130a (and/or the other row lines 130) and a corresponding second measurement made on column line 132a. In an alternative embodiment, the read logic 550 may incorporate the row selector circuit 515 and provide the voltage $V_{ROW}$ 525 to the row line 130a of the selected memory cell 120a while grounding the non-selected row lines.

As shown, a memory controller 510 may receive inputs 505, such as read control and address select signals, and may provide the appropriate row and column select signals to the row select circuit 515 and the column decoder circuit 535 on lines 512 and 530, respectively. A clock signal 555 may be applied to the read logic 550, for purposes of clocking, if a timing pulse is desired.

Note that FIG. 5 does not require the use of a reference element, i.e., a memory cell having a predetermined logic state. Nevertheless, a reference element could optionally be connected to row line 130a and a reference column line 132

(see FIG. 3). When the voltage $V_{ROW}$ 525 is applied to the memory cell 120a, the voltage $V_{ROW}$ 525 could also be applied to the reference element.

In various embodiments, the read logic 550 may variously include an analog-to-digital converter, decision logic, and/or one or more storage locations, such as could be used to store $V_{READ1}$, $V_{READ2}$, and a reference value. Note that the decision logic could be configured to manipulate various values to achieve a function value for comparison to the reference value.

Figure 6:
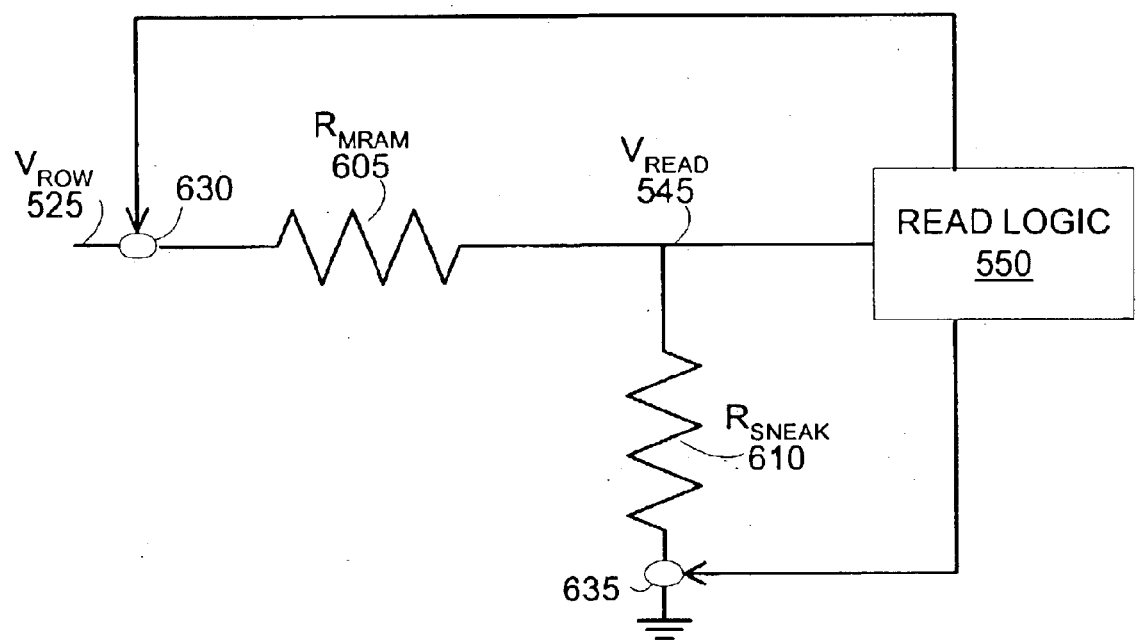
FIG. 6 is an illustration of the voltage divider circuit for nondestructive reads of the MTJ memory device, according to one embodiment of the present invention.

FIG. 6 is an illustration of a voltage divider circuit for reads of the MTJ memory device, according to one embodiment of the present invention. As shown, a bias voltage $V_{ROW}$ 525 is applied to the selected memory cell 120a resistance, $R_{CELL}$ 605, and through the sneak resistance $R_{SNEAK}$ 610 to ground. The voltage across the sneak resistance $R_{SNEAK}$ 610, which also provides a measurement of the induced voltage across the MTJ memory device, is shown as $V_{READ}$ 545. The voltage $V_{READ}$ 545 is read by a read logic 550.

Optional features of FIG. 6 include switches 630 and 635, which may be controlled by the adaptive comparator 550. The switches 630 and 635 allow for controlling which row line receives the bias voltage $V_{ROW}$ 525 while grounding the other row lines.

The read logic 550 may be a voltmeter and may be implemented in several forms. For example, in the form of a voltage mode amplifier, the time required to sense the voltage $V_{READ}$ 545 may be roughly 10–15 nS. In the form of a sigma-delta integrator, the time required to sense the voltage $V_{READ}$ 545 may be roughly 5–10 $\mu$S.

The disclosed two-point voltage mode non-destructive read methodology does not require the isolation of the MTJ memory device required with other methods. The methodology may also be faster than equivalent current sensing methods.

Recalling the differences in the slopes of the lines 402 and 404 shown in FIG. 4, the voltage divider equations for a first $V_{ROW}$ 525, $V_1$, and a second $V_{ROW}$ 525, $V_2$, here assumed greater than $V_1$, can be written:

$$\frac{V_{READ1}}{V_1} = \frac{R_{SNEAK}}{R_{CELL1} + R_{SNEAK}} \text{ and } \frac{V_{READ2}}{V_2} = \frac{R_{SNEAK}}{R_{CELL2} + R_{SNEAK}} \quad (1)$$

$R_{SNEAK}$ is approximately a constant and expected to be much less than $R_{CELL}$ at all times. Accordingly, the relatively small value of $R_{SNEAK}$ in the denominator may be ignored.

Dividing the second equation by the second equation yields:

$$\frac{V_{READ2}}{V_2} \bigg/ \frac{V_{READ1}}{V_1} = \frac{R_{CELL2}}{R_{CELL1}} \quad (2)$$

Referring to line 404 in FIG. 4, note that if the memory cell has the magnetic orientations parallel, then the resistance changes relatively little as a function of bias voltage.

$$\frac{V_{READ2}}{V_2} \bigg/ \frac{V_{READ1}}{V_1} = \frac{R_{CELL2}}{R_{CELL1}} = \frac{R}{R} = 1 \text{ for parallel state.} \quad (3)$$

Referring to line 402 in FIG. 4, note that if the memory cell has the magnetic orientations anti-parallel, then the resistance changes measurably as a function of bias voltage.

For explanatory purposes, assume that $R_{CELL1}$=1.15 R and $R_{CELL2}$=1.3 R.

$$\frac{V_{READ2}}{V_2} \bigg/ \frac{V_{READ1}}{V_1} = \frac{R_{CELL2}}{R_{CELL1}} = \frac{1.3R}{1.15R} = 1.13 \text{ for anti-parallel state.} \quad (4)$$

Thus by determining the ratio of the measured voltages or the calculated voltage divider ratio for a given memory cell 120a, the value of the ratio may be compared to a standard value. As noted above, a proportionality of calculated voltage divider ratios not significantly different from one may be an indication of parallel state in the given memory cell 120a.

The difference between the approximate value of one for parallel orientations and a measured value for a given implementation could depend on the measured ratio of the TMR for parallel orientations at the bias voltages. The TMR ratio or a value based on the TMR ratio for parallel orientations may be stored as a reference value for determining from the voltage divider measurements whether the memory cell has a parallel or anti-parallel orientation.

Although approximations are used in the above calculations, it is noted that more careful consideration of the equations does not invalidate the conclusions reached. Including relatively small value of $R_{SNEAK}$ in the denominator as well as the non-zero slope for the line 404 may simply allow for more careful determination of the reference value or the function to be used as the test.

Various embodiments of the present invention utilize the sneak resistance to provide the voltage divider circuit, as shown with respect to FIG. 6. In certain implementations, the system and method of the present invention utilize at least two measurements to determine the rate of change of the cell's resistance as a function of the applied voltage to more accurately determine the logic state of the memory cell, as described below with reference to FIG. 7 and FIG. 8.

The system and, method of the invention can be implemented in software (e.g., firmware), hardware, or a combination thereof. As a non-limiting example, the system may be implemented in a computer system 700 shown in FIG. 7, which includes software, as an executable program, that is executed by a special or general purpose processor, such as a processor in a personal computer (PC; IBM-compatible, Apple-compatible, or otherwise), workstation, minicomputer, or mainframe computer.

Figure 7:
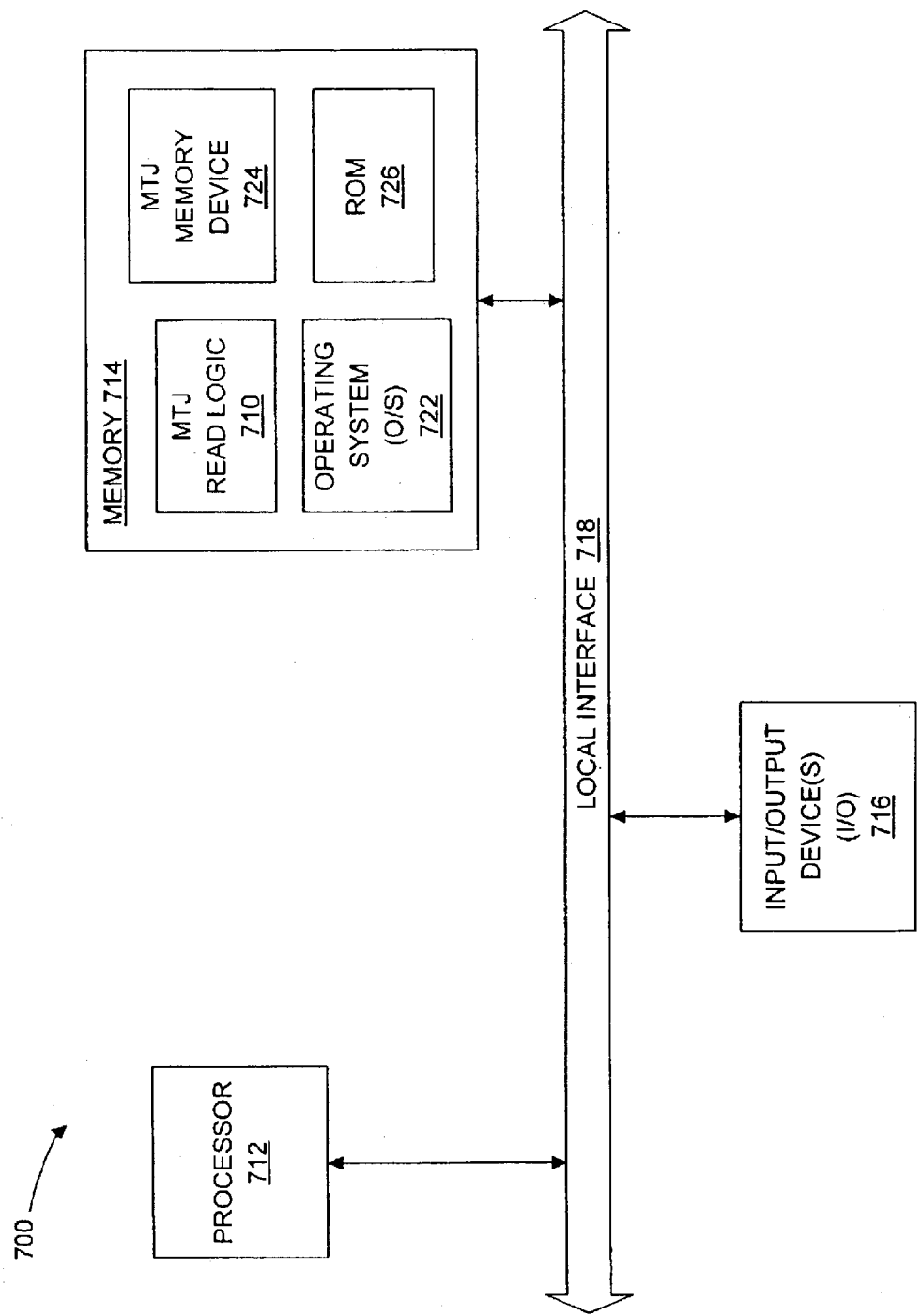
FIG. 7 is a simplified block diagram of a computer system which may incorporate a system and method for nondestructive reads of a memory cell in an MTJ memory device, such as an MRAM, according to one embodiment of the present invention.

Generally, in terms of hardware architecture, as shown in FIG. 7, the computer system 700 includes a processor 712, memory 714, and one or more input and/or output (I/O) devices 716 (or peripherals), all of which are communicatively-coupled via a local interface 718. The local interface 718 can be, for example but not limited to, one or more buses or other wired or wireless connections, as are known in the art. The local interface 718 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 712 is a hardware device for executing software, particularly that stored in memory 714. The processor 712 can be any custom made or commercially available processor, a central processing unit (CPU), an auxiliary processor among several processors associated with the computer system 700, a semiconductor based microprocessor (in the form of a microchip or chip set), a macroprocessor, or generally any device for executing software instructions.

The memory 714 can include any one or a combination of volatile memory elements (e.g., random access memory (RAM, such as DRAM, SRAM, SDRAM)) and nonvolatile memory elements (e.g., magnetic random access memory (MRAM), ROM, hard drive, tape, CDROM). An MRAM may be non-volatile while other types of RAM (i.e., DRAM, SRAM, SDRAM) are generally volatile. Thus, a nonvolatile MRAM rather than a volatile RAM may be used in certain applications. The desire to use a non-volatile memory further emphasizes the need for a system and method that can accurately determine the logic state of an MRAM.

The memory 714 also may incorporate electronic, magnetic, optical, and/or other types of storage media. Note that the memory 714 can have a distributed architecture, where various components are situated remote from one another, but can be accessed by the processor 712. Further, the memory 714 may have a hybrid architecture in which different types of memory are combined. In the example of FIG. 7, the memory 714 includes an MTJ memory device 724, which may be an MRAM, and a separate ROM 726.

The software in memory 714 may include one or more separate programs, each of which comprises an ordered listing of executable instructions for implementing logical functions. In the example of FIG. 7, the software in the memory 714 includes an operating system (O/S) 722. The operating system 722 essentially controls the execution of other computer programs and provides scheduling, input-output control, file and data management, memory management, and communication control and related services.

The MTJ read logic 710 may be hardwired read logic, or it may be a programmable logic device that executes firmware. The firmware may be expressible as a source program, executable program (object code), script, or any other form comprising a set of instructions to be performed. If expressed as a source program, firmware may be translated via a compiler, assembler, interpreter, or the like, which may or may not be included within the memory 714, so as to operate properly in connection with the O/S 722. Furthermore, the firmware for MTJ read logic 710 can be written as (a) an object oriented programming language, which has classes of data and methods, or (b) a procedure programming language, which has routines, subroutines, and/or functions, for example but not limited to, C, C++, Pascal, Basic, Fortran, Cobol, Perl, Java, and Ada.

The I/O devices 716 may include input devices, for example but not limited to, a keyboard, mouse, scanner, microphone. Furthermore, the I/O devices 716 may also include output devices, for example but not limited to, a printer, display. Finally, the I/O devices 716 may further include devices that communicate both inputs and outputs, for instance but not limited to, a modulator/demodulator (modem; for accessing another device, system, or network), a radio frequency (RF) or other transceiver, a telephonic interface, a bridge, a router.

If the computer 700 is a PC, workstation, or the like, the software in the memory 714 may further include a basic input output system (BIOS) (omitted for simplicity). The BIOS is a set of essential software routines that initialize and test hardware at startup, start the O/S 722, and support the transfer of data among the hardware devices. The BIOS is stored in ROM so that the BIOS can be executed when the computer 700 is activated.

When the computer 700 is in operation, the processor 712 is configured to execute software stored within the memory 714, to communicate data to and from the memory 714, and to generally control operations of the computer 700 pursuant to the software. The O/S 722 may be read by the processor 712, perhaps buffered within the processor 712, and then executed. As the processor requests software from memory 714, the MTJ read logic 710 operates to read the software as bits stored in the memory array and provides the software to the processor for execution.

When the MTJ read logic 710 is implemented in firmware, the MTJ read logic 710 can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The MTJ read logic 710 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the system is implemented in hardware, the MTJ read logic 710 may be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA). The read logic 710 illustrated in FIG. 7 functions in the same way as described above with respect to FIG. 3 to apply bias voltages to individual cells in MTJ memory device 724 so that the voltage across the MTJ device can be measured.

Figure 8:
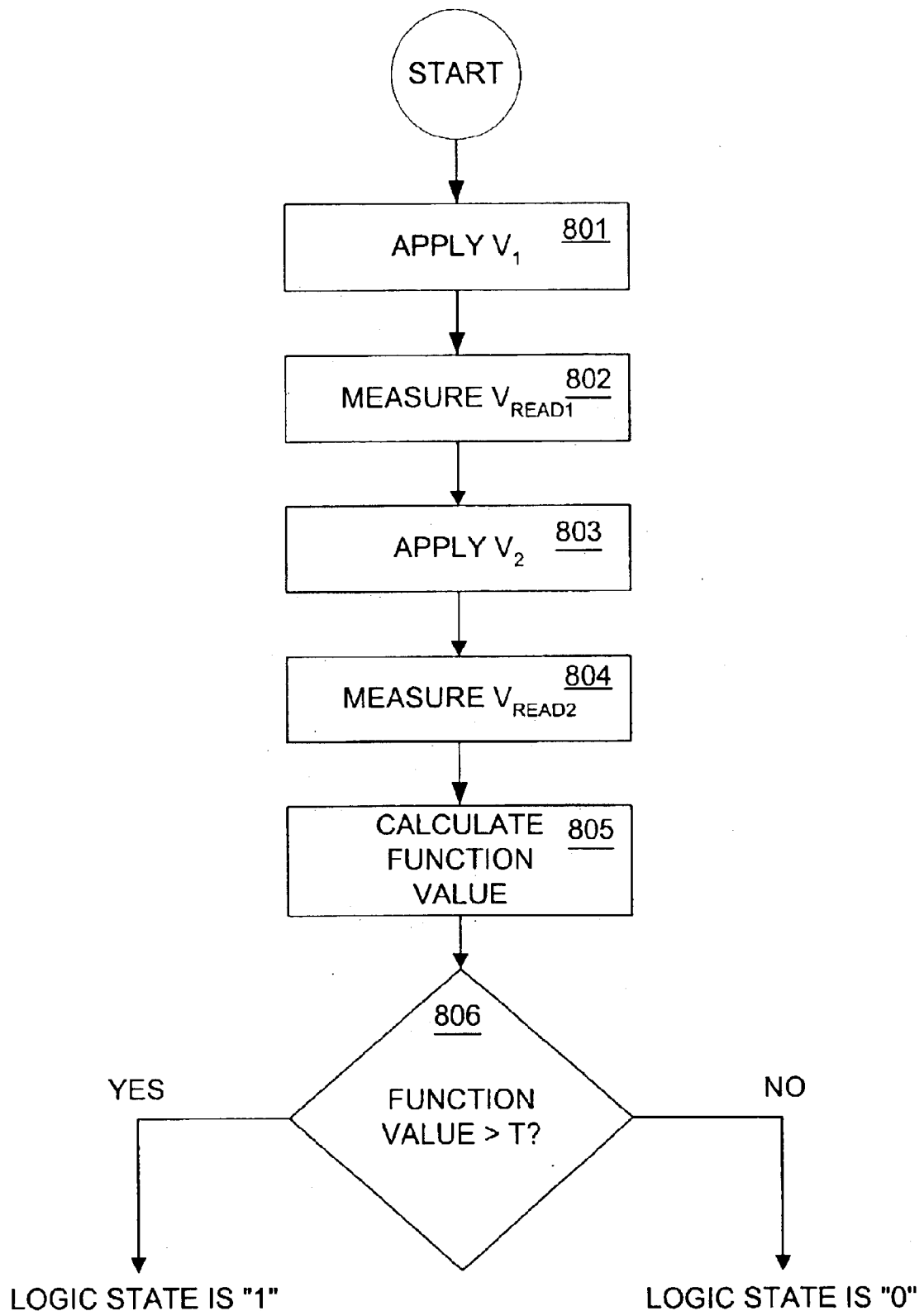
FIG. 8 is an exemplary flowchart illustrating a method of determining the logic state of an MTJ memory device, according to one embodiment of the present invention.

FIG. 8 is a flowchart of an embodiment of the method implemented that may be implemented by the read logic 550 of FIG. 5 or the MTJ read logic 710 of FIG. 7 to determine the state of a selected memory cell 120, such as in the MTJ memory device 724. In block 801, a first bias voltage ($V_1$) is applied to the selected cell. In block 802, the voltage across the MTJ device as the result of the first bias voltage ($V_1$) is measured.

In block 803, a second bias voltage ($V_2$) is applied to the cell by a biasing circuit. Voltage $V_2$ may be on the order of $V_1/3$ or $V_1/2$. However, this is not a critical limitation, and other values for $V_2$ may be used so long as $V_2$ is different from $V_1$. In block 804, the voltage induced across the MTJ device as the result of the second bias voltage ($V_2$) is measured by sensing circuit 732.

In block 805, a value for a function involving two or more of V1, V2, Vread1 and Vread2 is determined. For example, the ratio discussed above from the voltage divider equations may be determined. Other functions related to parameters from the MTJ device may also be used Finally, in block 806, the function value computed in block 805 is compared to a predetermined threshold (T), which may be stored in ROM 726 (of FIG. 7). If the function value is higher than the threshold (T), the cell may be determined to be in the anti-parallel state (i.e., a logic "0"). If the ratio is less than the threshold, the cell may be determined to be in the parallel state (i.e., logic "1"). Note that the threshold may also be determined from parameter values of the MTJ device, and may be dynamically adjusted if desired.

By relying on the slope of the resistance curve between two bias points rather than an absolute resistance measurement, this measurement technique may be less sensitive to increases in the bias voltage than other techniques. Thus, the present technique may be operated with an adequate signal to noise ratio at higher bias voltages than other techniques, which are limited by the large reduction in TMR as the voltage bias increases, and the consequent degradation of the signal to noise ratio.

The measurement technique described above also does not require a destructive read. The technique may therefore operate faster while consuming less power and generating fewer half-select errors than other systems and methods for determining the state of an MTJ device. In addition, the technique is expected to be compatible with the natural variations that occur during the production of an MRAM array, which may lead to large variations in resistance among the various cells in an array. Additionally, the requirement that a predetermined threshold be stored in a separate non-volatile memory (e.g., ROM 726 of FIG. 7) can be eliminated by computing a dynamic threshold based on, for example, a set of reference cells within the array some of which are always left in the parallel configuration and others of which are always left in the anti-parallel configuration. The threshold could be derived dynamically by performing blocks 801 through 805 of FIG. 8 on the reference cells, and then using the ratio computed for the reference cells in block 805 as the threshold value when blocks 801 through 806 are performed with respect to the selected cells. Determining the threshold dynamically would have the advantage that operating conditions would be automatically compensated for as would other unrelated process variables that would affect the reference cells and data cells given that they would be fabricated simultaneously.

A software implementation of the embodiments described above may comprise a series of computer instructions either fixed on a storage medium, such as a computer readable media, e.g., a diskette, a CD-ROM, a ROM, or fixed disk, or transmittable to a computer system, via a modem or other interface device, such as a communications adapter connected to the network over a transmission medium. The transmission medium can be either a tangible medium, including but not limited to optical or analog communications lines, or may be implemented with wireless techniques, including but not limited to microwave, infrared or other transmission techniques, such as the Internet. The series of computer instructions embodies all or part of the functionality previously described herein with respect to a given embodiment of the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. Such a computer program product may be distributed as a removable media with accompanying printed or electronic documentation, e.g., shrink wrapped software, pre-loaded with a computer system, e.g., on system ROM or fixed disk, or distributed from a server or electronic bulletin board over a network, e.g., the Internet or World Wide Web.

It will be apparent to those skilled in the art that many modifications and variations may be made to the embodiments as set forth above, without departing substantially from the principles of the present invention. For example, various embodiments described herein are directed to a two point derivative of the resistance versus bias curves. In either state this derivative can be just as much a distinguishing factor between states as a measured difference in resistance between states at constant bias. An alternative embodiment could use a true derivative circuit in place of a simple sensing circuit to extract the information exemplified in FIG. 4. The true derivative circuit could determine the logic state of the cell in question. Other modifications and variations may be implemented in order to exploit the basic concept of using the gradient of resistance with respect to applied bias as a means of detecting the state of an MTJ device. All such modifications and variations are intended to be included herein within the scope of the present invention, as defined in the claims that follow.

What is claimed is:

1. A method for determining a logic state of a magnetic tunnel junction (MTJ) memory device, the method comprising:
   applying a first bias voltage to a selected line;
   measuring a first induced voltage across the MJT device;
   applying a second bias voltage to the selected line, the second bias voltage being different from the first bias voltage;
   measuring a second induced voltage across the MJT device; and
   comparing a function of two or more of the first bias voltage, the first induced voltage, the second bias voltage, and the second induced voltage to a threshold value.

2. The method of claim 1, wherein the second bias voltage is less than the first bias voltage.

3. The method of claim 1, wherein the second bias voltage is greater than the first bias voltage.

4. The method of claim 1, wherein comparing the function of the two or more of the first bias voltage, the first induced voltage, the second bias voltage, and the second induced voltage to the threshold value comprises comparing a ratio of a first ratio of the second induced voltage to the second bias voltage and a second ratio of the first induced voltage to the first bias voltage to the threshold.

5. The method of claim 4, wherein the threshold is one.

6. The method of claim 4, wherein the threshold is a ratio of the tunneling magneto resistance ratio (TMR) at the first bias voltage and the second bias voltage.

7. The method of claim 1, wherein measuring the first induced voltage across the MJT device comprises measuring the voltage across a sneak resistance of the MJT device; and wherein measuring the second induced voltage across the MJT device comprises measuring the voltage across the sneak resistance of the MJT device.

8. The method of claim 1, wherein the MTJ device is a magnetic random access memory (MRAM).

9. The method of claim 8, wherein the MRAM is an MRAM array.

10. The method of claim 1, wherein applying the first bias voltage to a selected line comprises applying a first row voltage to the selected line while applying a first lesser voltage than the first row voltage to non-selected lines; and wherein applying the second bias voltage to the selected line, the second bias voltage being different from the first bias voltage comprises applying a second row voltage to the selected line while applying a second lesser voltage than the second row voltage to non-selected lines.

11. The method of claim 10, wherein applying the first row voltage to the selected line while applying the first lesser voltage than the first row voltage to non-selected lines comprises applying the first row voltage to the selected line while grounding the non-selected lines; and wherein applying the second row voltage to the selected line while applying a second lesser voltage than the second row voltage to non-selected lines comprises applying the second row voltage to the selected line while grounding the non-selected lines.

12. A system for determining the logic state of a magnetic tunnel junction (MTJ) memory device, the system comprising:

a biasing circuit configured to supply at least two different biasing voltages to a selected line;

a sensing circuit configured to measure the induced voltage across the MTJ device at each of the at least two different biasing voltages; and a processing element configured to compare a function of at least two of the first bias voltage, the first induced voltage, the second bias voltage, and the second induced voltage to a threshold value.

13. The system of claim 12, wherein the biasing circuit, the sensing circuit, the processing element and the MTJ device are fabricated as an application specific integrated circuit (ASIC).

14. The system of claim 12, wherein the biasing circuit is a voltage supply.

15. The system of claim 12, wherein the sensing circuit is a voltmeter.

16. The system of claim 12, wherein the MTJ device is a magnetic random access memory (MRAM).

17. The system of claim 16, wherein the MRAM is an MRAM array.

18. A memory comprising:

an array of MTJ cells configured to accept a bias voltage for a selected memory cell along a first line and to provide a read voltage across the sneak resistance of the array of MTJ cells to a read logic along a second line;

a memory controller configured to receive one or more inputs;

a biasing circuit configured to provide the bias voltage to the selected memory cell at least twice with different voltage values; and the read logic configured to receive the read voltage across the sneak resistance of the array of MTJ cells for each of the difference voltage values.

19. The memory of claim 18, further comprising:

decision logic configured to receive at least the read voltage across the sneak resistance of the array of MTJ cells for each of the difference voltage values, wherein the decision logic is further configured to determine a function value using at least the read voltage across the sneak resistance of the array of MTJ cells for each of the difference voltage values and to compare the function value to a threshold value.

20. The memory of claim 19, further comprising:

one or more storage locations.

21. The memory of claim 20, wherein the one or more storage locations are accessible to the decision logic and the read logic and configured to store one or more of a first bias voltage, a first induced voltage, a second bias voltage, a second induced voltage, and the threshold value.

22. A system, comprising:

a processor;

a memory accessible to the processor, wherein the memory includes;

an array of MTJ calls configured to accept a bias voltage for a selected memory cell along a first line and to provide a read voltage across the sneak resistance of the array of MTJ cells to a read logic along a second line;

a memory controller configured to receive one or more inputs;

a biasing circuit configured to provide the bias voltage to the selected memory cell at least twice with different voltage values; and the read logic configured to receive the read voltage across the sneak resistance of the array of MTJ cells for each of the difference voltage values.

23. The system of claim 22, the memory further comprising:

decision logic configured to receive at least the read voltage across the sneak resistance of the array of MTJ cells for each of the difference voltage values, wherein the decision logic is further configured to determine a function value using at least the read voltage across the sneak resistance of the array of MTJ cells for each of the difference voltage values and to compare the function value to a threshold value.

24. The system of claim 23, the memory further comprising:

one or more storage locations.

25. The system of claim 24, wherein the one or more storage locations are accessible to the decision logic and the read logic and configured to store one or more of a first bias voltage, a first induced voltage, a second bias voltage, a second induced voltage, and the threshold value.

26. A memory, comprising:

an array of MTJ cells configured to accept a bias voltage for a selected memory cell along a first line and to provide a read voltage across the selected memory cell to a read logic along a second line;

a memory controller configured to receive one or more inputs;

a biasing circuit configured to provide the bias voltage to the selected memory cell at least twice with different voltage values; and the read logic configured to receive the read voltage across the selected memory cell for each of the difference voltage values.

27. The memory of claim 26, further comprising:

decision logic configured to receive at least the read voltage across the selected memory cell for each of the difference voltage values, wherein the decision logic is further configured to determine a function value using at least the read voltage across the selected memory cell for each of the difference voltage values and to compare the function value to a threshold value.

* * * * *